United States Patent [19]
Wendt

[11] Patent Number: 5,687,725
[45] Date of Patent: Nov. 18, 1997

[54] METHOD FOR MOTION TRACKING OF INTERVENTIONAL INSTRUMENTS WITH MR IMAGING

[75] Inventor: Michael Wendt, Witten, Germany

[73] Assignee: Siemens Aktiengesellschaft, Munich, Germany

[21] Appl. No.: 690,938

[22] Filed: Aug. 1, 1996

[30] Foreign Application Priority Data

Aug. 2, 1995 [DE] Germany .................. 195 28 436.4

[51] Int. Cl.$^6$ .................................................. A61B 05/055
[52] U.S. Cl. .................. 128/653.2; 324/307; 324/309
[58] Field of Search .................................. 324/307, 309; 128/653.2, 653.4, 899, 721

[56] References Cited

U.S. PATENT DOCUMENTS

| | | |
|---|---|---|
| 5,168,226 | 12/1992 | Hinks . |
| 5,200,701 | 4/1993 | Siebold et al. . |
| 5,422,572 | 6/1995 | Yao . |
| 5,474,067 | 12/1995 | Laub . |
| 5,502,384 | 3/1996 | Nakaya et al. . |
| 5,541,512 | 7/1996 | Dumoulin et al. . |
| 5,544,653 | 8/1996 | Takahashi et al. . |
| 5,577,502 | 11/1996 | Darrow et al. . |

OTHER PUBLICATIONS

"Keyhole imaging offers shortcut to fast MR scans", Casey, Diagnostic Imaging, Feb. 1993, p. 36.

"Implementation of Wavelet-encoded MR Imaging", Panych et al, Journal of Magnetic Resonance Imaging, vol. 3 (1993), pp. 649–655.

"Wavelet-Encoded MR Imaging", Weaver et al, Magnetic Resonance in Medicine, vol.24 (1992), pp. 275–287.

"A Dynamically Adaptive Imaging Algorithm for Wavelet-Encoded MRI", Panych et al, Magnetic Resonance in Medicine, vol.32 (1994), pp. 738–748.

Primary Examiner—Marvin M. Lateef
Assistant Examiner—Shawna J. Shaw
Attorney, Agent, or Firm—Hill, Steadman & Simpson

[57] ABSTRACT

In a method for motion tracking an Interventional Instrument with MR Imaging, the interventional instrument is guided on a motion path in a first direction, raw datasets are acquired from nuclear magnetic resonance signals frequency-encoded in the first direction and wavelet-encoded in a second direction perpendicular to said first direction, the raw datasets are updated with a repetition rate only for the wavelet-encodings that are allocated to the region of the motion path, and chronologically-resolved images are acquired from the raw datasets.

13 Claims, 4 Drawing Sheets

METHOD FOR MOTION TRACKING OF INTERVENTIONAL INSTRUMENTS WITH MR IMAGING

BACKGROUND OF THE INVENTION

1. Field of the Invention

The present invention is directed to a method for tracking an interventional instrument, such as a biopsy or a surgical instrument, in a patient using magnetic resonance imaging.

2. Description of the Prior Art

A comparatively good accessibility to the patient during the examination is established with certain magnet systems for nuclear magnetic tomography apparatus as available, for example, from Siemens AG under the designation "MAGNETOM OPEN®". Such open magnetic systems afford the possibility of working on the patient with interventional instruments during the MR imaging. For example, surgery and biopsy are typical applications, with the position of the instrument in the patient being observed on a picture screen. It is evident that chronologically and spatially exact information about the position of the instrument in the body are required. Real-time monitoring of the instrument position given the required spatial resolution and an adequately high contrast-to-noise ratio, however, imposes extreme demands of the speed of the data acquisition and processing when the entire raw dataset is to be updated.

The article "Keyhole Imaging Offers Short Cut to Fast MR-Scans" in Diagnostic Imaging, February 1993, page 36, discloses that the time resolution in MR imaging be improved by not acquiring the complete raw dataset every time in the individual sequence repetitions. On the contrary, only a fast update of the middle k-space rows ensues within the framework of this so-called keyhole technique. A conventional Fourier transformation technique is employed wherein these middle k-space rows make the primary contribution in defining the signal-to-noise increase. Similar techniques for time-resolved MR imaging are disclosed in U.S. Pat. No. 5,168,226 and German Patent DE 43 27 325, corresponding to U.S. Pat. No. 5,474,067. In the acquisition of a number of raw data matrices at different points in time of a motion sequence, signals for two chronologically successive raw data matrices are thereby employed, i.e. only some of the raw data rows are updated for each acquired image. The aforementioned techniques have the disadvantage that the resolution in the display of moving objects decreases dependent on the raw data that are not updated.

The articles by L. P. Panych et al., "A Dynamically Adaptive Imaging Algorithm for Wavelet-Encoded MRI" in Magnetic Resonance in Medicine 32, pages 738 through 748 (1994) and L. P. Panych et al., "Implementation of Wavelet-encoded MR Imaging" in Journal of Magnetic Resonance Imaging, 1993, 3, pages 649 through 655, discloses the use of wavelet transformation as an alternative to phase encoding and conventional Fourier transformation. Differing from Fourier transformation, wavelet functions are spatially localized, i.e. wavelet profiles are generated at different locations over the observation window. Discrete Fourier transformation, by contrast, always covers the entire observation field. Moreover, Fourier transformation converts a periodic signal from the locus space into the frequency space; however, it does not supply any information about the point in time and the location at which a specific frequency occurred.

In the aforementioned article, "A Dynamically Adaptive Imaging Algorithm for Wavelet-encoded MRI", the spatially selective property of wavelet transformation is employed for acquiring movements in the observation window and for updating the raw data only for the regions in which movement actually occurs. A motion direction in the direction of the wavelet coding thereby forms the basis for this technique.

The motion direction is usually known in advance, given the introduction of interventional instruments. Often, only the extent to which the interventional instrument has already been introduced into the body need be determined, for example in order to encounter specific organs for surgery or biopsy and to avoid damage to other organs in the introduction of the interventional instrument.

SUMMARY OF THE INVENTION

It is an object of the invention to implement a method for motion tracking of interventional instruments with MR imaging wherein both a high time resolution and a good topical resolution of the position of the interventional instrument are achieved.

The above object is achieved in accordance with the principles of the present invention in a method for tracking the motion of an interventional instrument using magnetic resonance imaging wherein the interventional instrument is guided along a motion path in a first direction, raw data sets are acquired from nuclear magnetic resonance signals which are frequency-encoded in the first direction and wavelet-encoded in a second direction perpendicular to the first direction, the raw data sets are updated with a repetition rate only for wavelet-encodings that are allocated to the region of the motion path, and chronologically-resolved images are acquired from the raw data sets.

Since the motion path is relative accurately known, only a small part of the nuclear magnetic resonance signals need be updated, so that the data acquisition time decreases correspondingly and the time resolution increases. Differing from the above-cited method of Panych, however, the dataset for the entire region of the motion path is always updated in the inventive method, so that the entire instrument inside the examination subject is always displayed with good spatial resolution because of the averaging over a number of measurements. In the method of Panych, however, only datasets for the regions where a change occurs are updated. In the present case, this would be the case only in the region of the tip of the instrument.

Compared to the known keyhole technique or the employment of data rows for a number of chronologically successive images, the spatial localization of the wavelet function is utilized in the inventive method.

DESCRIPTION OF THE PREFERRED EMBODIMENTS

Figure 1:
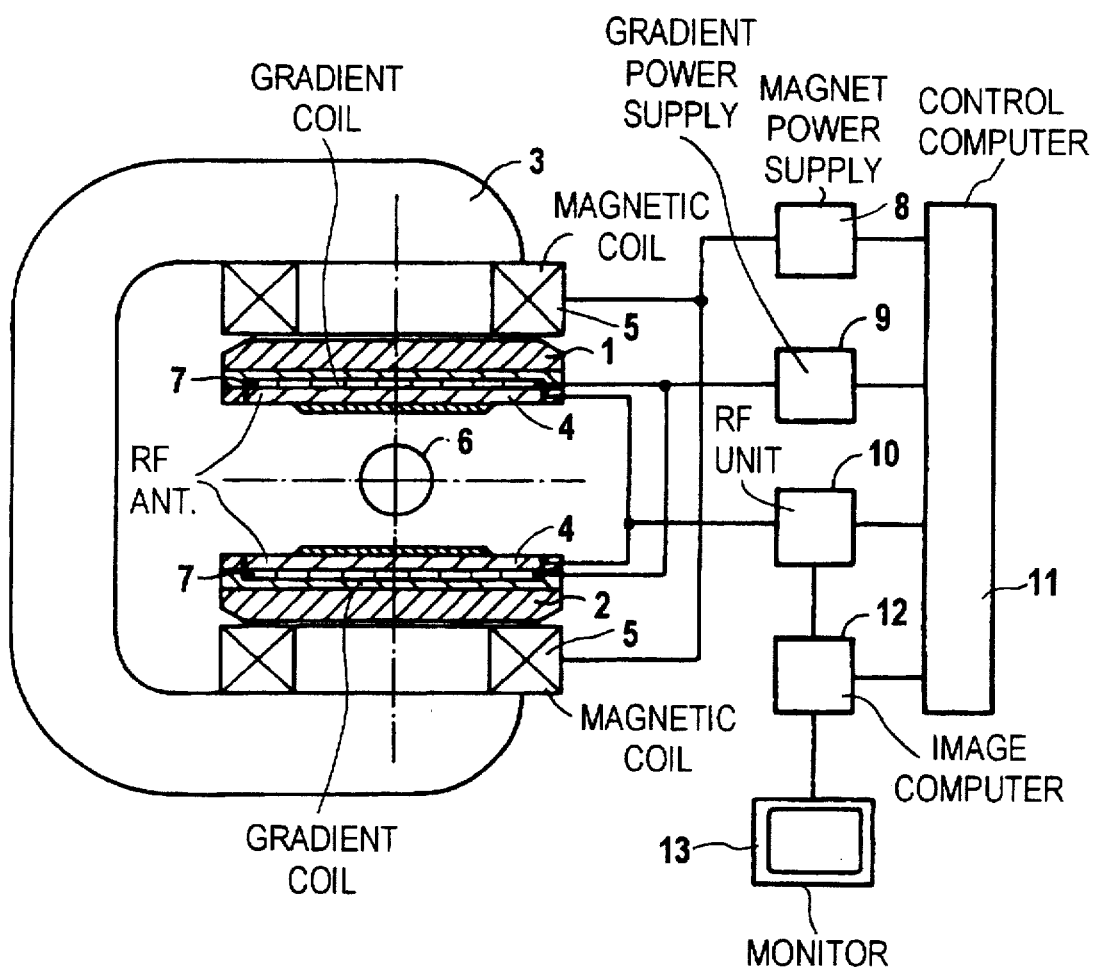
FIG. 1 schematically shows the structure of an open magnet system of a known type.

FIG. 1 schematically shows a known pole shoe magnet of a nuclear magnetic resonance tomography apparatus with a C-shaped yoke as disclosed, for example, by U.S. Pat. No. 5,200,701. In the exemplary embodiment of FIG. 1, the magnetic drive ensues with normally conductive magnetic coils 5. Respective gradient coils sets 7 and radiofrequency antennas 4 are attached in the region of pole shoes 1 and 2. In the exemplary embodiment, the radiofrequency antennas 4 serve for transmitting as well as for receiving signals. An examination subject 6 is positioned in the magnet.

The magnetic coils 5 are supplied by a magnet power supply 8 and the gradient coil sets 7 are supplied by a gradient power supply 9. The antennas 4 are connected to a radiofrequency unit 10. An image that is displayed on a monitor 13 is reconstructed by an image computer 12 from the signals acquired from the radiofrequency unit 10. The magnet power supply 8, the gradient power supply 9, the radiofrequency unit 10 and the image computer 12 are controlled by a control computer 11.

The fundamentals of wavelet transformation are explained in detail in the initially cited references and shall only be outlined here. The integral wavelet transformation $F_{g(a,b)}$ of a real-value, energy-limited function $f(x)$ is established by $$F_g(a,b) = \frac{1}{\sqrt{a}} \int f(x) \cdot g\left(\frac{x-b}{a}\right) dx$$

Figure 2:
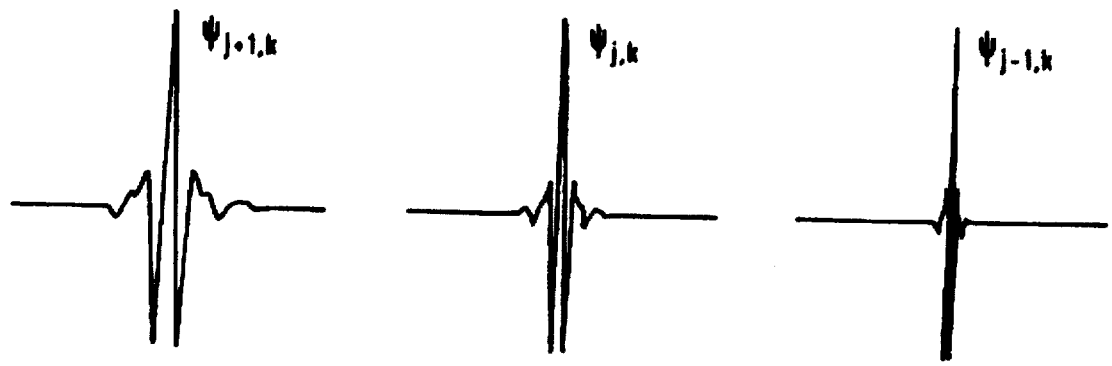
FIG. 2 shows wavelets with three different dilations a for explaining the invention.
Figure 3:
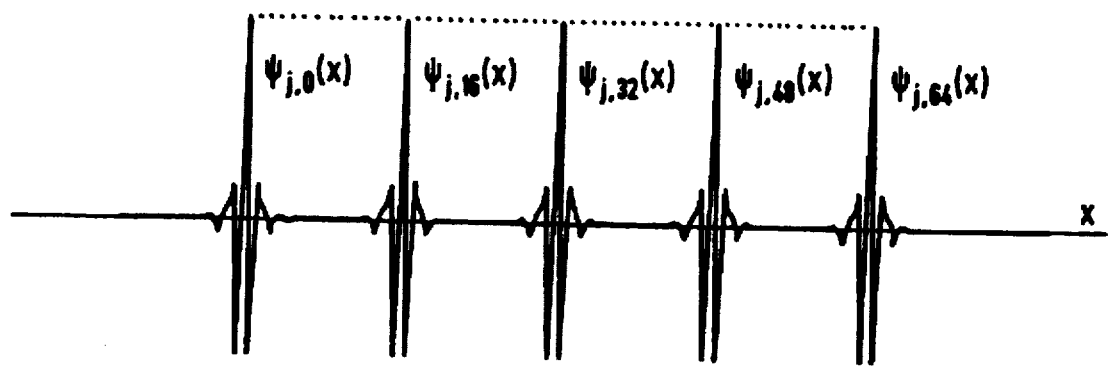
FIG. 3 shows the translation of the wavelet functions over the subject.
Figure 4:
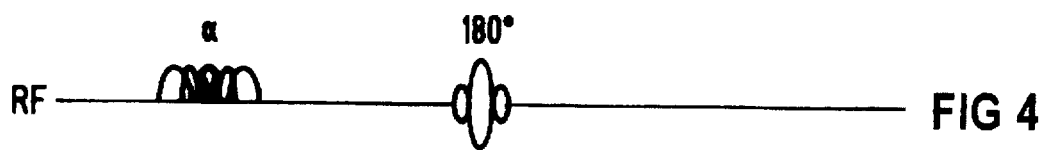
FIGS. 4–8 show a first exemplary embodiment of a pulse sequence with wavelet coding in accordance with the invention.
Figure 5:
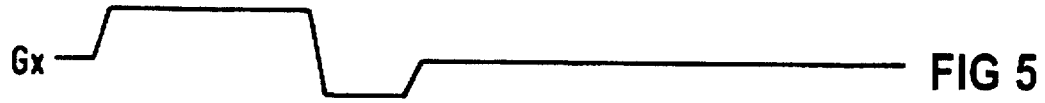
Figure 6:
Figure 7:
Figure 8:
Figure 12:
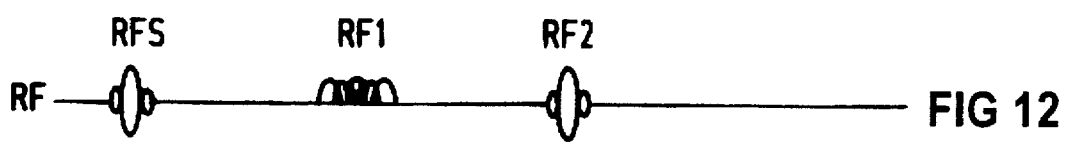
FIGS. 12–16 show a second exemplary embodiment of a pulse sequence with wavelet coding in accordance with the invention.
Figure 13:
Figure 14:
Figure 15:
Figure 16:
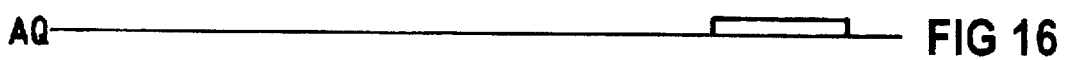

A wavelet function $g(a,b)$ arises by dilation and translation of a base wavelet function, i.e. the wavelet transformation. Thus, in contrast to Fourier transformation, the wavelet function is imaged based on two parameters. The dilation a influences the width of a wavelet function $g(a,b)$ and the translation b influences its position in the object space. A number of functions are known that can be employed as base wavelet functions. Battle-Lemarie wavelets were employed in one exemplary embodiment. The arising wavelet functions is schematically shown in FIGS. 2 and 3. The index j indicates the dilation and the index k indicates the translation of the base wavelet function. FIG. 2 shows the dilation of the base wavelet function $\psi_{j,k}$ for three different dilations a. According to FIG. 3, the wavelets are shifted across the subject in a spatial direction in each dilation, however, only every sixteenth translation of the translations running from 0 through 64 was entered. The other translations are indicated with dots. Corresponding to the dilation parameters, arbitrarily wide object windows from which the raw data are then read out can be generated. A broad windowing (equivalent to a small dilation a) of the object region corresponds to a low pass filtering effect whereas the wavelet function becomes narrower with increasing a and thus increasingly assumes a high-pass character.

FIGS. 4 through 8 show the application of wavelet encoding in a pulse sequence. A simple spin echo function is applied in the applied example; other method for generating echoes, however, could alternatively be utilized. For wavelet encoding of the signals, a radiofrequency pulse RF1 is first emitted under the influence of a gradient Gx. In combination with the gradient Gx, the frequency spectrum of the radiofrequency pulse RF1 determines dilation and translation of the wavelet function. A stripe profile can be designationally selected perpendicular to the direction of the gradient Gx. For small flip angles of the radiofrequency pulse RF1, the envelope of this radiofrequency pulse and the stripe profile demanded here are a Fourier transform pair. The dilation a and the strength of the gradient Gx behave proportionally to one another. As a result, the dilation a is increased due to an intensification of the gradient Gx, and thus the stripe width is reduced. The required translation b can be achieved by shifting the center frequency of the radiofrequency pulse RF1 or by an offset of the gradient Gx. Subsequently, the gradient Gx is inverted in order to cancel the dephasing caused by the positive subpulse. At the same time, a pre-phasing is achieved by a first gradient pulse Gy1 in the y-direction.

Figure 9:
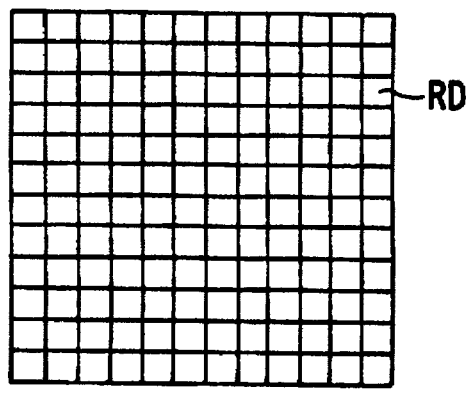
FIG. 9 shows a raw data matrix detailed in accordance with the invention.

A refocussing of the spins ensues with a 180° radiofrequency pulse RF2. This is emitted under the influence of a slice-selection gradient GZ. The entire pulse sequence thus becomes slice-selective in the z-direction, i.e. signals are only obtained from a slice perpendicular to the z-axis, the position and width of the slice being determined by the frequency spectrum of the 180° radiofrequency pulse RF2 and by the amplitude of the gradient $G_z$. Finally, the arising spin echo signal is read out in an acquisition window under the influence of a gradient Gy. The spin echo signal is thus frequency-encoded in the y-direction in a known way. Similar to the conventional Fourier transformation method, the signal is entered into a row of a raw data matrix RD according to FIG. 9.

Here, the wavelet encoding replaces the phase encoding of the nuclear magnetic resonance signals that is otherwise standard. As in phase encoding, N measurements with different wavelet encoding must be undertaken in the wavelet encoding in order to fill N rows of the image matrix. As already set forth above, these N measurements are implemented with different dilations and translations of the base wavelet function. A special characteristic of the wavelet coefficients compared to the Fourier coefficients is of significance for the following application. Corresponding to their dilation and translation, the wavelet coefficients correlate with a defined excerpt of the object space.

An image can then be reconstructed from the raw data matrix according to methods explained in the references cited in the introduction to the specification.

Figure 10:
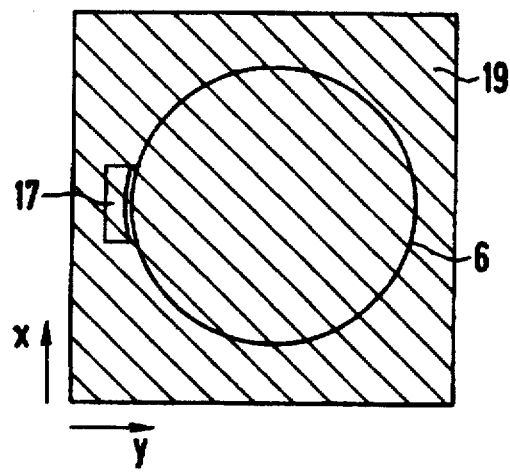
FIG. 10 shows a subject region to be imaged.
Figure 11:
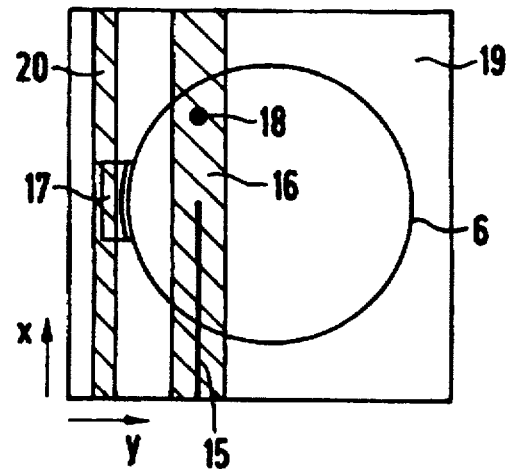
FIG. 11 shows a subject region with a region of a motion path to be imaged.

The application of wavelet encoding to the task of motion tracking of interventional instruments is explained below with reference to FIGS. 10 and 11. A biopsy needle is employed as the interventional instrument in the exemplary embodiment; however, other instruments, for example surgical instruments, also come into consideration for which at least a rough definition of the motion path is desirable.

It is important to the physician to determine the position of the biopsy needle 15 in the examination subject with good chronological and spatial resolution. To that end, a reference image of the entire object space 19 with the examination subject 6 is recorded. This is schematically shown in FIG. 10. This reference image, of course, could be recorded with the described wavelet encoding, i.e. with wavelet-encoded excitation of the nuclear magnetic resonance signals. Compared to phase encoding, however, wavelet-encoded excitation produces a poorer signal-to-noise ratio. This is because signals from the entire object region are always acquired in phase encoding but signals from only individual stripes are acquired given wavelet-encoded excitation. Further, small flip angles are utilized in wavelet encoding. It is therefore recommended to first utilize standard phase encoding for acquiring the reference image since the advantage of wavelet encoding—namely the limitation to an object region—does not take effect anyway. So that the dataset of the reference image is compatible later with updated, wavelet-encoded datasets, the acquired, digital raw data matrix is inversely Fourier-transformed in the phase-encoding direction and is subsequently wavelet-encoded for after-processing. The image is thus divided into N stripes corresponding to the factors a and b of the wavelet encoding. After the complete reconstruction (inverse Fourier transformation in the direction of the read-out gradient and inverse wavelet encoding in wavelet-encoding direction), a wavelet-encoded image, whose signal-to-noise ratio essentially corresponds to a standard spin echo image, is present.

As already stated, an adequate time resolution for the motion tracking of the biopsy needle could hardly be achieved with conventional Fourier transformation methods. Since the motion path of the biopsy needle, however, is relatively exactly known in advance, it suffices merely to update the datasets that lie in the region of the known motion path 16 of the biopsy needle 15. In FIG. 11, the region 16 of the motion path to be acquired is shown shaded; the target to be reached with the biopsy needle 15 is referenced 18. As described above, wavelet encoding makes it possible to selectively register the region 16. The frequency-encoding direction y thereby lies parallel to the motion direction of the biopsy needle 15 and the wavelet-encoding direction x lies orthogonal thereto.

Since significantly fewer data contributions need be acquired for the updating of the raw data from the region 16 compared to the object space 19, this can ensue with correspondingly improved time resolution. When, for example, one proceeds on the basis of a 30×30 cm image with a resolution of 128×128 pixels, 128 sequences according to FIGS. 4 through 8 are required for updating the entire image. If, however, the motion region 16 can be limited to, for example, 20 mm, then only 12 sequences are required given the same spatial resolution, i.e. the dataset required for updating can be acquired about 10 times as fast. Only 12 rows in the original raw dataset covering the entire reference image need be updated during the intervention. Since, for the reasons cited above, the datasets acquired with the wavelet encoding have a lower signal amplitude than the signals of the reference image acquired on the basis of a phase encoding, the updated, wavelet-encoded datasets must be correspondingly normalized.

The image acquired from the raw datasets acquired in this way thus shows the entire examination subject in good spatial resolution and also shows the movement of the biopsy needle 15 in good time resolution. Since the signals from the biopsy needle 15 only change with respect to the tip thereof between the individual updatings of the dataset, the signals from the remaining part of the biopsy needle 15 are constantly averaged. Despite the low signal intensity due to the wavelet encoding, the biopsy needle 15 can be displayed with good signal-to-noise ratio due to the averaging of the signals (with the exception of signals from the moving tip of the biopsy needle).

It was assumed in the previous observations that only the biopsy needle 15 moves in the examination region, whereas the rest of the examination subject 6 is stationary. Given movement of the entire examination subject 6, of course, the spatial allocation between the updated region 16 and the rest of the examination subject 6, acquired only at the beginning of the measurement in the form of a reference image, no longer agrees. Often, however, the physician no longer needs the information from the rest of the examination subject since he or she still remembers it during the interventional procedure. In order to avoid the display of misinformation, however, it is recommended to blank out the reference image as soon as a subject movement has occurred and to then display only the region 16 of the motion path.

In order to determine movement on the part of the subject 6, an MR-sensitive marker 17 can, for example, be attached to the subject. In this case, for example in a further region 20, wavelet-encoded datasets can then likewise be acquired and the movement of the marker 17 can be acquired on the basis of these datasets. The reference image is blanked out as soon as the movement of the marker 17 exceeds a certain threshold.

Alternatively, the reference image, i.e. the dataset for the entire examination subject 6, can be updated as soon as greater movement of the subject 6 has been found.

A second exemplary embodiment of a wavelet-encoded pulse sequence is shown in FIGS. 12 through 16. This pulse sequence is known from J. B. Weaver et al., "Wavelet-Encoded MR Imaging", Magnetic Resonance in Medicine 24, 275–287 (1992). This reference is therefore referenced for a more detailed explanation.

The exemplary embodiment of FIGS. 12 through 16 differs from that according to FIGS. 4 through 8 in that a slice selection in the z-direction is achieved by a selective saturation instead of by the 180° radiofrequency pulse. To that end, a radiofrequency saturation pulse RFS is emitted under the influence of a slice selection gradient Gz of FIG. 15 before the radiofrequency pulse RF1. By an appropriate selection of the frequency spectrum of the radiofrequency saturation pulse RFS, all nuclear spins outside the desired slice are saturated, i.e. do not contribute to the signal.

This type of slice selection makes it possible to apply a multi-slice method known from conventional image acquisition with Fourier transformation. An excitation of a further slice thereby ensues during the repetition time, i.e. during the time phase between excitation and readout of the nuclear magnetic resonance signal in a slice. Since the arising nuclear magnetic resonance signals likewise occur chronologically offset corresponding to the chronologically offset excitation, they can be unproblematically separated.

This technique can also be transferred to the objective herein. A nuclear magnetic resonance signal can be excited in the region 20 in the time between the excitation of a nuclear magnetic resonance signal in the motion region 16 and the readout of the nuclear magnetic resonance signal from this region, so that the acquisition of data from the region 20 for the acquisition of the movement of the marker 17 involves only minimal lengthening of the data acquisition time.

The technique of excitation in a slice during the repetition time of the other slice, however, can also be applied to the region 16 itself. When the individual stripes are acquired in the wavelet encoding such that no spatial overlap of the stripes occurs in chronologically successive acquisitions, an excitation can ensue in one stripe and read out can ensue during the repetition time in the other stripe.

In the above presentation, the motion path was in the y-direction, and accordingly wavelet encoding was implemented in the x-direction and frequency encoding of the nuclear magnetic resonance signals was implemented in the y-direction. The method, however, is not limited to a rigid coordinate system since resultant gradients in arbitrary directions can be realized in MR systems by simultaneous activation of a plurality of gradients.

In order to display the biopsy needle is shown with good contrast in the image, it can be filled with negative contrast agent, for example iron oxide. It is then displayed black in the image.

With the illustrated method, tracking the movement of an interventional instrument is accomplished with good time resolution since always only a slight part of the overall dataset is updated. The property of the wavelet function, namely that the data pick-up can be localized, thereby has an especially positive effect compared to phase encoding, which always extends over the entire measured subject. At the same time, however, the method also supplies a high spatial resolution. A qualitatively high-grade image can thus be generated in the acquisition of the reference image with standard phase encoding as a result of the high signal-to-noise ratio that can thus be achieved. The less beneficial signal-to-noise ratio associated per se with wavelet encoding can be improved again in the region of the motion path by averaging the sequentially acquired data.

Although modifications and changes to the presently preferred embodiments described herein will be apparent to those skilled in the art, such changes and modifications can be made without departing from the spirit and scope of the present invention and without diminishing its attendant advantages. Therefore, the appended claims are intended to cover such changes and modifications.

I claim as my invention:

1. A method for tracking the motion of an interventional instrument in a patient using magnetic resonance imaging, comprising:

guiding an interventional instrument in a patient along a motion path in a first direction;

acquiring raw datasets from nuclear magnetic resonance signals of an image region in said subject, including at least a part of said motion path, from nuclear magnetic resonance signals which are frequency-encoded in a first direction and wavelet-encoded in a second direction perpendicular to the first direction;

updating the raw datasets with a repetition rate only for wavelet-encoded data allocated to a region of the motion path in said image region; and generating chronologically-resolved images from the raw data sets.

2. A method as claimed in claim 1 wherein the step of acquiring raw datasets includes exciting nuclear magnetic resonance signals in said patient slice-selectively in a slice having a normal with said motion path proceeding perpendicular to said normal.

3. A method as claimed in claim 1 wherein the step of acquiring raw datasets includes acquiring a raw dataset for a reference image of an entire object region at a beginning of a measurement sequence, and wherein the step of updating the raw datasets comprises gating updating portions of said raw datasets for the wavelet-encoded data into said reference image.

4. A method as claimed in claim 3 wherein the step of acquiring said reference image comprises acquiring said reference image with a magnetic resonance imaging sequence including phase-encoding of the nuclear magnetic resonance signals in said second direction, and subsequently wavelet-encoding data in said raw dataset in said second direction.

5. A method as claimed in claim 4 comprising the step of inversely Fourier-transforming said raw dataset in the second direction before wavelet-encoding said data therein.

6. A method as claimed in claim 4 comprising the additional step of normalizing the updated data regions of said raw dataset for causing signal amplitudes of the updated regions to correspond to signal amplitudes of the raw dataset of the reference image.

7. A method as claimed in claim 3 wherein said patient is subjected to patient movement, and comprising the additional step of generating a new reference image if said patient movement exceeds a predetermined threshold.

8. A method as claimed in claim 7 comprising the additional step of blacking out said reference image and producing an image only using said updated raw dataset as soon as said patient movement exceeds said predetermined threshold.

9. A method as claimed in claim 7 comprising the additional step of acquiring a measurement of said patient movement by placing a marker on said patient identifiable in said raw datasets, and measuring said patient movement by analyzing said raw datasets.

10. A method as claimed in claim 9 comprising the additional step of acquiring said raw datasets for identifying movement with wavelet-encoding allocated to a region of the patient on which said marker is disposed, and updating said raw datasets with a repetition rate.

11. A method as claimed in claim 10 comprising the step of interleaving wavelet-encoding data relating to the position of said marker with data identifying said motion path.

12. A method as claimed in claim 1 wherein the step of updating said raw datasets comprises updating wavelet-encoded data corresponding to a region of said motion path with a repetition rate for displaying said interventional instrument with a chronological resolution corresponding to an advancement rate of said interventional instrument along said motion path and said patient.

13. A method as claimed in claim 1 comprising the additional step of providing said interventional instrument with a negative contrast agent.

* * * * *